United States Patent
Iijima et al.

(10) Patent No.: US 11,063,062 B2
(45) Date of Patent: Jul. 13, 2021

(54) SEMICONDUCTOR DEVICE AND METHOD OF MANUFACTURING THE SAME

(71) Applicant: TOSHIBA MEMORY CORPORATION, Minato-ku (JP)

(72) Inventors: Jun Iijima, Yokkaichi (JP); Masayoshi Tagami, Kuwana (JP); Shinya Arai, Yokkaichi (JP); Takahiro Tomimatsu, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/564,783

(22) Filed: Sep. 9, 2019

(65) Prior Publication Data
US 2020/0295037 A1    Sep. 17, 2020

(30) Foreign Application Priority Data
Mar. 11, 2019 (JP) .............................. JP2019-044106

(51) Int. Cl.
| | |
|---|---|
| *H01L 27/11582* | (2017.01) |
| *H01L 27/11573* | (2017.01) |
| *H01L 23/522* | (2006.01) |
| *H01L 23/00* | (2006.01) |

(52) U.S. Cl.
CPC .... *H01L 27/11582* (2013.01); *H01L 23/5226* (2013.01); *H01L 24/09* (2013.01); *H01L 27/11573* (2013.01)

(58) Field of Classification Search
CPC ......... H01L 27/11582; H01L 27/11573; H01L 23/5226; H01L 24/09
See application file for complete search history.

(56) References Cited

U.S. PATENT DOCUMENTS

| | | |
|---|---|---|
| 9,558,945 B2 | 1/2017 | Fukuzumi et al. |
| 10,297,578 B2 | 5/2019 | Tagami et al. |
| 2018/0261575 A1 | 9/2018 | Tagami et al. |
| 2018/0277497 A1 | 9/2018 | Matsuo |
| 2019/0363129 A1 | 11/2019 | Yokoyama et al. |

FOREIGN PATENT DOCUMENTS

| | | |
|---|---|---|
| JP | 2016-62901 A | 4/2016 |
| TW | 201834152 A | 9/2018 |
| TW | 201841344 A | 11/2018 |

*Primary Examiner* — Anthony Ho
(74) *Attorney, Agent, or Firm* — Oblon, McClelland, Maier & Neustadt, L.L.P.

(57) ABSTRACT

In one embodiment, a semiconductor device includes a first chip and a second chip. The first chip includes a first substrate, a control circuit provided on the first substrate, and a first pad provided above the control circuit and electrically connected to the control circuit. The second chip includes a second pad provided on the first pad, a plug provided above the second pad, extending in a first direction, and including a portion that decreases in diameter in a cross-section perpendicular to the first direction with increasing distance from the first substrate, and a bonding pad provided on the plug, intersecting with the first direction, and electrically connected to the second pad by the plug.

9 Claims, 11 Drawing Sheets

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2019-044106, filed on Mar. 11, 2019, the entire contents of which are incorporated herein by reference.

FIELD

Embodiments described herein relate to a semiconductor device and a method of manufacturing the same.

BACKGROUND

In a semiconductor device formed by bonding plural wafers using a bonding technology, preferable layout of bonding pads and preferable interconnections between the bonding pads and a logic circuit or the like are adopted in consideration of a manufacturing cost and reliability, for example.

DETAILED DESCRIPTION

Figure 1:
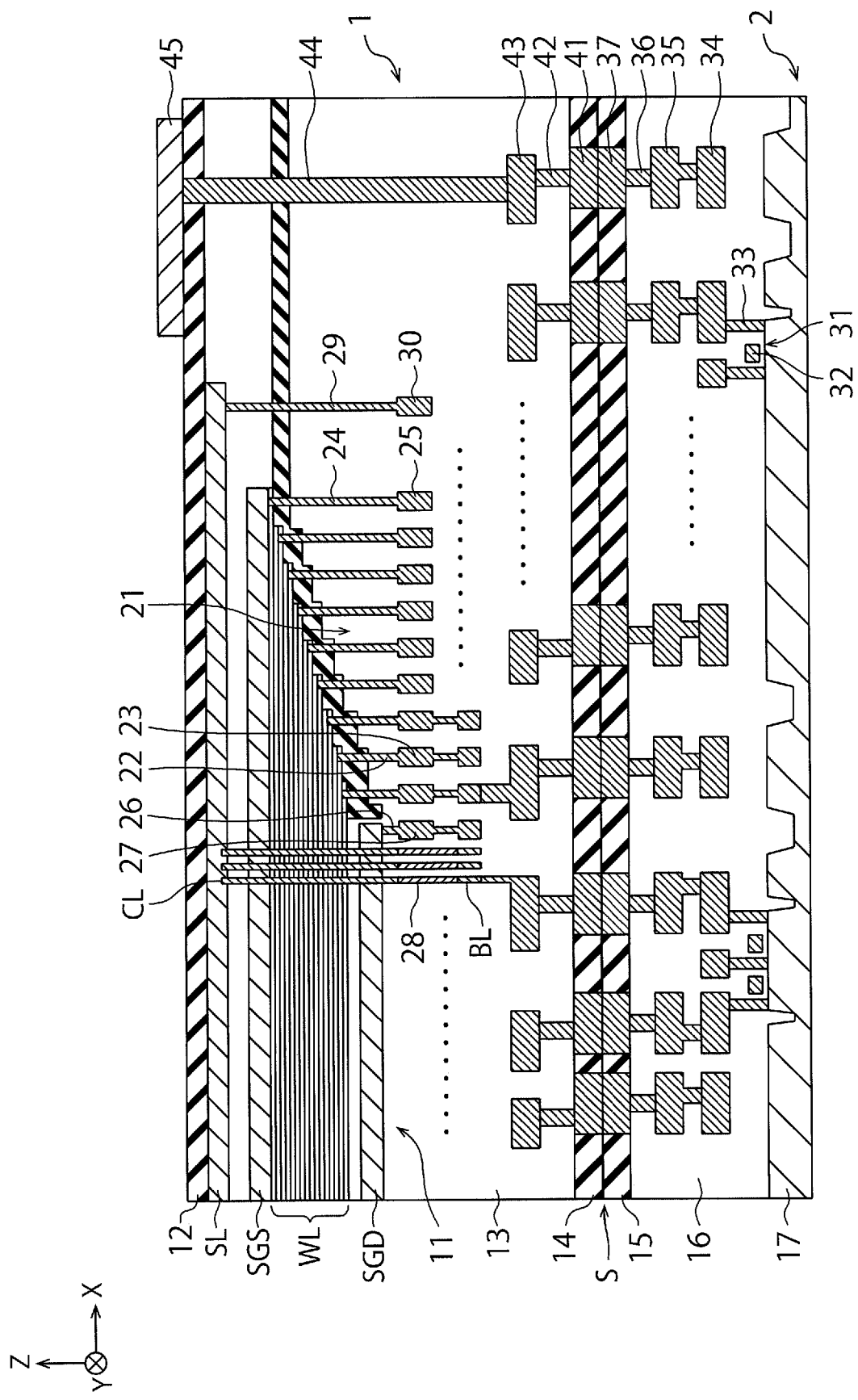
FIG. 1 is a cross-sectional view illustrating a structure of a semiconductor device of a first embodiment.

In one embodiment, a semiconductor device includes a first chip and a second chip. The first chip includes a first substrate, a control circuit provided on the first substrate, and a first pad provided above the control circuit and electrically connected to the control circuit. The second chip includes a second pad provided on the first pad, a plug provided above the second pad, extending in a first direction, and including a portion that decreases in diameter in a cross-section perpendicular to the first direction with increasing distance from the first substrate, and a bonding pad provided on the plug, intersecting with the first direction, and electrically connected to the second pad by the plug.

Embodiments will now be explained with reference to the accompanying drawings. In FIGS. 1 to 11, identical or equivalent components are denoted by identical reference numerals, and overlapped description is omitted.

First Embodiment

FIG. 1 is a cross-sectional view illustrating a structure of a semiconductor device of a first embodiment. The semiconductor device in FIG. 1 is a three-dimensional memory in which an array chip 1 and a circuit chip 2 are bonded to each other.

The array chip 1 includes a memory cell array 11 including a plurality of memory cells, an insulator 12 on the memory cell array 11, an inter layer dielectric 13 below the memory cell array 11, and an insulator 14 below the inter layer dielectric 13. Each of the insulators 12 and 14 is, for example, a silicon oxide layer or a silicon nitride layer.

The circuit chip 2 is provided below the array chip 1. A sign S indicates a bonding face between the array chip 1 and the circuit chip 2. The circuit chip 2 includes an insulator 15, an inter layer dielectric 16 below the insulator 15, and a substrate 17 below the inter layer dielectric 16. The insulator 15 is, for example, a silicon oxide layer or a silicon nitride layer. The substrate 17 is, for example, a semiconductor substrate such as a silicon substrate. The substrate 17 is an example of a first substrate.

FIG. 1 illustrates an X direction and a Y direction that are parallel to a surface of the substrate 17 and are perpendicular to each other, and a Z direction that is perpendicular to the surface of the substrate 17 and intersects with the substrate 17. In the present specification, the +Z direction is handled as an upward direction, and a −Z direction is handled as a downward direction. For example, the memory cell array 11 is positioned above the substrate 17, and the substrate 17 is positioned below the memory cell array 11. The −Z direction may be coincident with or may not be coincident with a gravity direction. The Z direction is an example of a first direction. The X direction and the Y direction are also parallel to a surface of a substrate 18 described below, and the Z direction is also perpendicular to the surface of the substrate 18.

The array chip 1 includes, as electrode layers inside the memory cell array 11, a plurality of word lines WL, a source-side selection gate SGS, a drain-side selection gate SGD, and a source line SL. FIG. 1 illustrates a stair structure portion 21 of the memory cell array 11. As illustrated in FIG. 1, each of the word lines WL is electrically connected to a word interconnection layer 23 through a contact plug 22, and the source-side selection gate SGS is electrically connected to a source-side selection gate interconnection layer 25 through a contact plug 24. Further, the drain-side selection gate SGD is electrically connected to a drain-side selection gate interconnection layer 27 through a contact plug 26, and the source line SL is electrically connected to a source interconnection layer 30 through a contact plug 29. A columnar portion CL that penetrates through the word lines WL, the source-side selection gate SGS, and the drain-side selection gate SGD is electrically connected to a bit line BL through a plug 28, and is electrically connected to the source line SL.

The circuit chip 2 includes a plurality of transistors 31. Each of the transistors 31 includes a gate electrode 32, an unillustrated source diffusion layer, and an unillustrated drain diffusion layer. The gate electrode 32 is provided on the substrate 17 with a gate insulator in between. The source diffusion layer and the drain diffusion layer are provided inside the substrate 17. The circuit chip 2 further includes a plurality of plugs 33, an interconnection layer 34, and an interconnection layer 35. The plurality of plugs 33 are provided on the source diffusion layers or the drain diffusion layers of the transistors 31. The interconnection layer 34 is provided on the plugs 33 and includes a plurality of interconnections. The interconnection layer 35 is provided on the interconnection layer 34 and includes a plurality of interconnections. The circuit chip 2 further includes a plurality of via plugs 36 and a plurality of metal pads 37. The plurality of via plugs 36 are provided on the interconnection layer 35. The plurality of metal pads 37 are provided on the via plugs 36 inside the insulator 15. Each of the metal pads 37 is an example of a first pad. Each of the metal pads 37 is, for example, a Cu (copper) layer or an Al (aluminum) layer. The circuit chip 2 functions as a control circuit (logic circuit) controlling the array chip 1. The control circuit includes the transistors 31 and the like, and is electrically connected to the metal pads 37.

The array chip 1 includes a plurality of metal pads 41, a plurality of via plugs 42, and an interconnection layer 43. The plurality of metal pads 41 are provided on the metal pads 37 inside the insulator 14. The plurality of via plugs 42 are provided on the metal pads 41. The interconnection layer 43 is provided on the via plugs 42 and includes a plurality of interconnections. The word lines WL and the bit lines BL are each electrically connected to a corresponding interconnection inside the interconnection layer 43. Each of the metal pads 41 is an example of a second pad. Each of the metal pads 41 is, for example, a Cu layer or an Al layer. The array chip 1 further includes a via plug 44 and a metal pad 45. The via plug 44 is provided inside the inter layer dielectric 13 and the insulator 12 and is provided on the interconnection layer 43. The metal pad 45 is provided on the insulator 14 and the via plug 44. The metal pad 45 is, for example, a Cu layer or an Al layer, functions as an external connection pad (bonding pad) of the semiconductor device of FIG. 1, and is connectable to a mounting substrate or the other device through a bonding wire, a solder ball, a metal bump, or the like.

Figure 2:
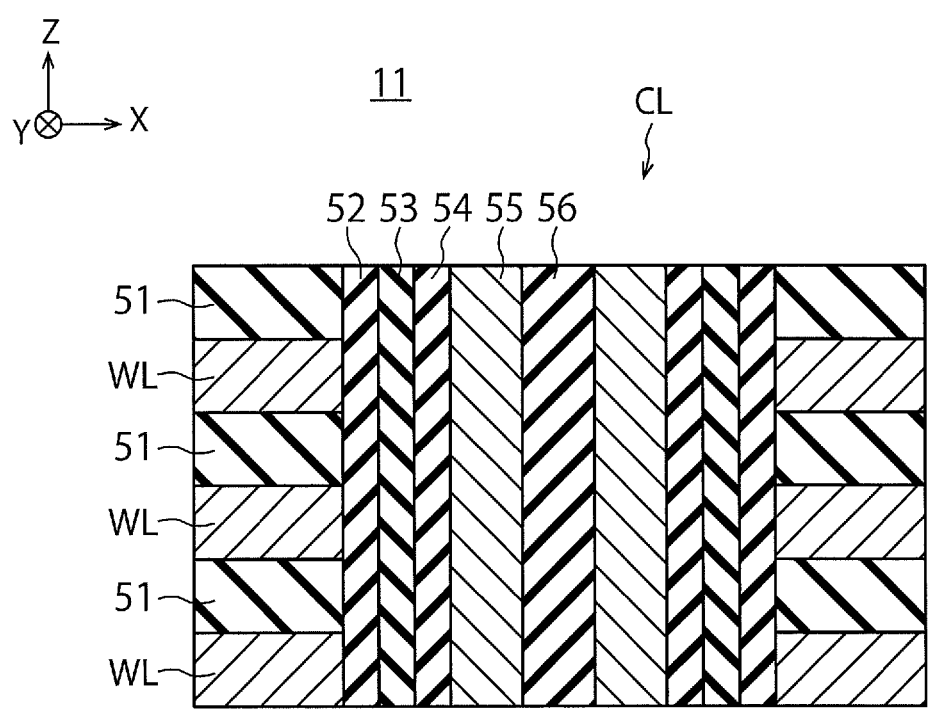
FIG. 2 is a cross-sectional view illustrating a structure of a columnar portion included in the semiconductor device of the first embodiment.

FIG. 2 is a cross-sectional view illustrating a structure of the columnar portion CL included in the semiconductor device of the first embodiment.

As illustrated in FIG. 2, the memory cell array 11 includes the plurality of word lines WL and a plurality of insulators 51 that are alternately provided on the inter layer dielectric 13 (FIG. 1). These word lines WL are stacked separately from one another in the Z direction. The word lines WL are examples of the electrode layers. Each of the word lines WL is, for example, a W (tungsten) layer. Each of the insulators 51 is, for example, a silicon oxide layer.

The columnar portion CL includes a block insulator 52, a charge storage layer 53, a tunnel insulator 54, a channel semiconductor layer 55, and a core insulator 56 in order. The charge storage layer 53 is, for example, a silicon nitride layer, and is provided on side faces of the word lines WL and the insulators 51 with the block insulator 52 in between. The channel semiconductor layer 55 is, for example, a polysilicon layer, and is provided on a side face of the charge storage layer 53 with the tunnel insulator 54 in between. Each of the block insulator 52, the tunnel insulator 54, and the core insulator 56 is, for example, a silicon oxide layer or a metal insulator.

In FIG. 1, the insulator 14 is provided on a lower face of the inter layer dielectric 13; however, the insulator 14 may be included in and integrated with the inter layer dielectric 13. Likewise, in FIG. 1, the insulator 15 is provided on an upper face of the inter layer dielectric 16; however, the insulator 15 may be included in and integrated with the inter layer dielectric 16. In FIGS. 3 to 11 described below, the reference numerals 14 and 15 are not illustrated because the insulator 14 is included in and integrated with the inter layer dielectric 13, and the insulator 15 is included in and integrated with the inter layer dielectric 16. In FIGS. 3 to 11, however, the insulator 14 may be provided on the lower face of the inter layer dielectric 13, and the insulator 15 may be provided on the upper face of the inter layer dielectric 16.

In FIG. 1, the columnar portion CL is provided inside the memory cell array 11 and is positioned inside the plurality of word lines WL configuring the memory cell array 11. On the other hand, the via plug 44 is provided outside the memory cell array 11 and is positioned outside the plurality of word lines WL configuring the memory cell array 11. The via plug 44 is provided in a side direction of the memory cell array 11, and is provided in the X direction of the memory cell array 11 in FIG. 1. The via plug 44 is, for example, a metal layer or a semiconductor layer.

The substrate 17 of the present embodiment includes a first region located below the via plug 44 and a second region located below the memory cell array 11. The first region is a region on right side in FIG. 1, and the second region is a region on left side in FIG. 1. The via plug 44 and the metal pads 37, 41, and 45 electrically connected to the via plug 44 are located above the substrate 17 in the first region. In contrast, the memory cell array 11 is located above the substrate 17 in the second region. The via plug 44 is electrically connected to the control circuit in the circuit chip 2 through the metal pads 37 and 41.

As illustrated in FIG. 1, the via plug 44 of the present embodiment includes a portion (columnar portion) having a columnar shape extending long in the Z direction. A lower end (end portion in −Z direction) of the via plug 44 is provided at a position lower than a lower face of the lowermost word line WL, and an upper end (end portion in +Z direction) of the via plug 44 is provided at a position higher than an upper face of the uppermost word line WL. The lower end of the via plug 44 is the end portion on a side of the circuit chip 2, and the upper end of the via plug 44 is the end portion on a side opposite to the circuit chip 2. The detail of the via plug 44 is described below.

Figure 3:
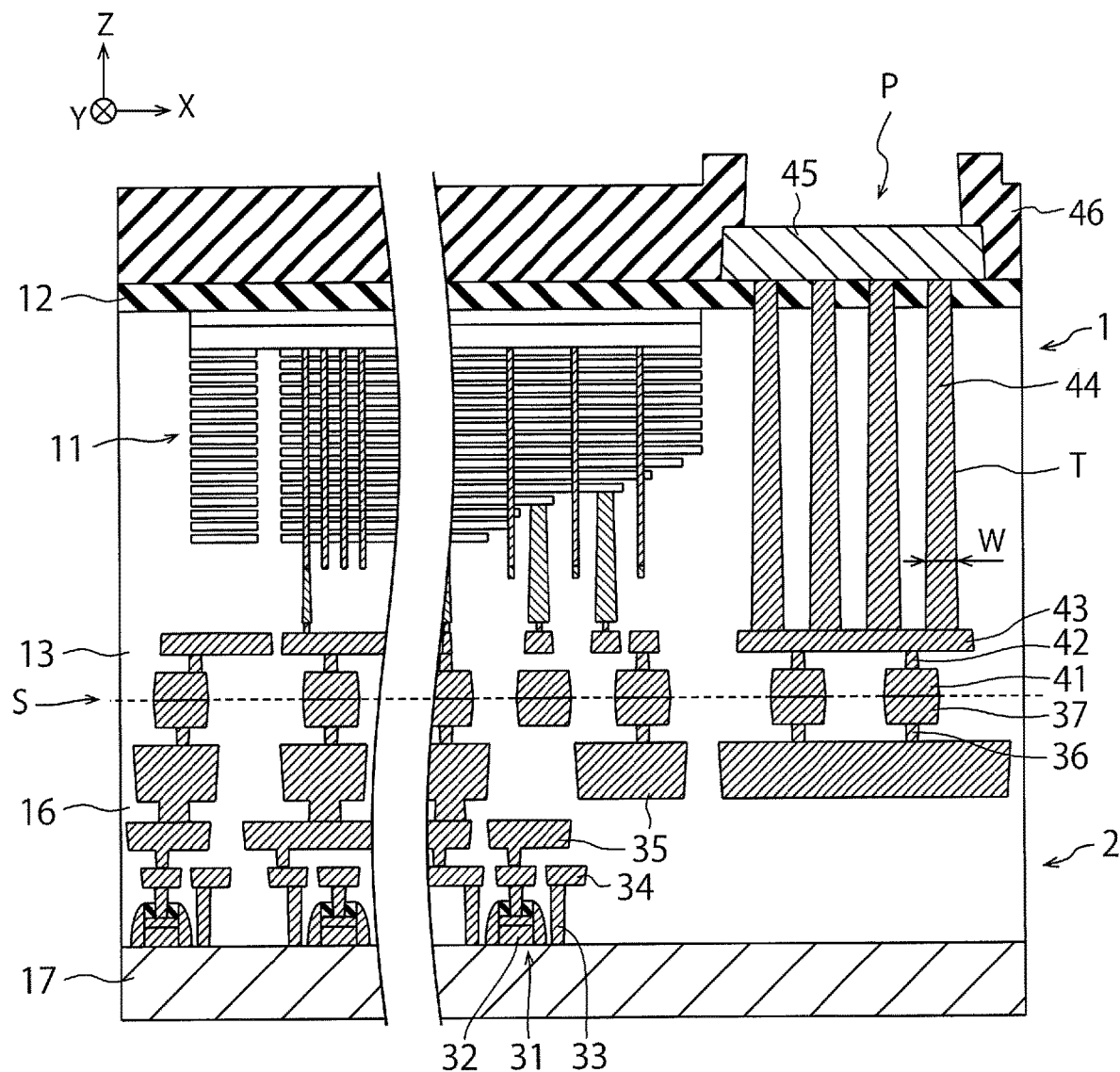
FIG. 3 is a cross-sectional view illustrating another structure of the semiconductor device of the first embodiment.

FIG. 3 is a cross-sectional view illustrating another structure of the semiconductor device of the first embodiment. FIG. 3 illustrates the cross-section of the semiconductor device as with FIG. 1, but illustrates an interconnection structure of the semiconductor device from a viewpoint different from FIG. 1.

The array chip 1 of the present embodiment includes a plurality of via plugs 44 between the metal pads 41 and the metal pad 45. These via plugs 44 extend in the Z direction, are electrically connected to the metal pads 41 through the via plugs 42 and the interconnection layer 43, and are electrically connected to the metal pad 45. In the present embodiment, the metal pads 41 and the metal pad 45 are electrically connected by the plurality of via plugs 44, which makes it possible to save a material for formation of the via plugs 44 and to easily form the via plugs 44, for example.

FIG. 3 illustrates a side face T of each of the via plugs 44 and a width W of each of the via plugs 44. The side face T of each of the via plugs 44 of the present embodiment has a tapered shape. As a result, the width W of each of the via plugs 44 of the present embodiment is reduced based on a distance from the circuit chip 2. Therefore, the width W of an upper end of each of the via plugs 44 is smaller than the width W of a lower end of each of the via plugs 44. For example, in a case where each of the via plugs 44 has a columnar shape, the width W corresponds to a plug diameter (diameter) of each of the via plugs 44.

The plug diameter of each of the via plugs 44 in a case where each of the via plugs 44 has a shape other than the columnar shape is specified as follows in the present embodiment. First, when considering the plug diameter of each of the via plugs 44 in a Z coordinate, attention is paid to a shape of an XY cross-section of each of the via plugs 44 in the Z coordinate. For example, the shape of the XY cross-section of each of the via plugs 44 is an elliptical shape or a rectangular shape. Next, the shape of the XY cross-section is replaced with a circle having the same area. Further, a diameter of the circle is specified as the plug diameter of each of the via plugs 44 in the Z coordinate. In the present embodiment, each of the via plugs 44 is formed such that the plug diameter of each of the via plugs 44 is reduced based on the distance from the circuit chip 2 and the plug diameter of the upper end of each of the via plugs 44 becomes smaller than the plug diameter of the lower end of each of the via plugs 44. In a case where the shape of each of the via plugs 44 is close to the columnar shape, the plug diameter of each of the via plugs 44 is a value close to the width W of each of the via plugs 44. The plug diameter of each of the via plugs 44 of the present embodiment is an example of a diameter of a plug.

The array chip 1 further includes a passivation layer 46 provided on the insulator 12 and the metal pad 45. The passivation layer 46 is, for example, an insulator such as a silicon oxide layer and a silicon nitride layer. The passivation layer 46 includes an opening P to expose an upper face of the metal pad 45. For example, the opening P is used to connect a bonding wire to the metal pad 45. The opening P of the present embodiment is provided at a position where the opening P overlaps with the via plugs 44 in the Z direction, namely, provided just above the via plugs 44.

FIGS. 4 to 10 are cross-sectional views illustrating a method of manufacturing the semiconductor device of the first embodiment.

Figure 4:
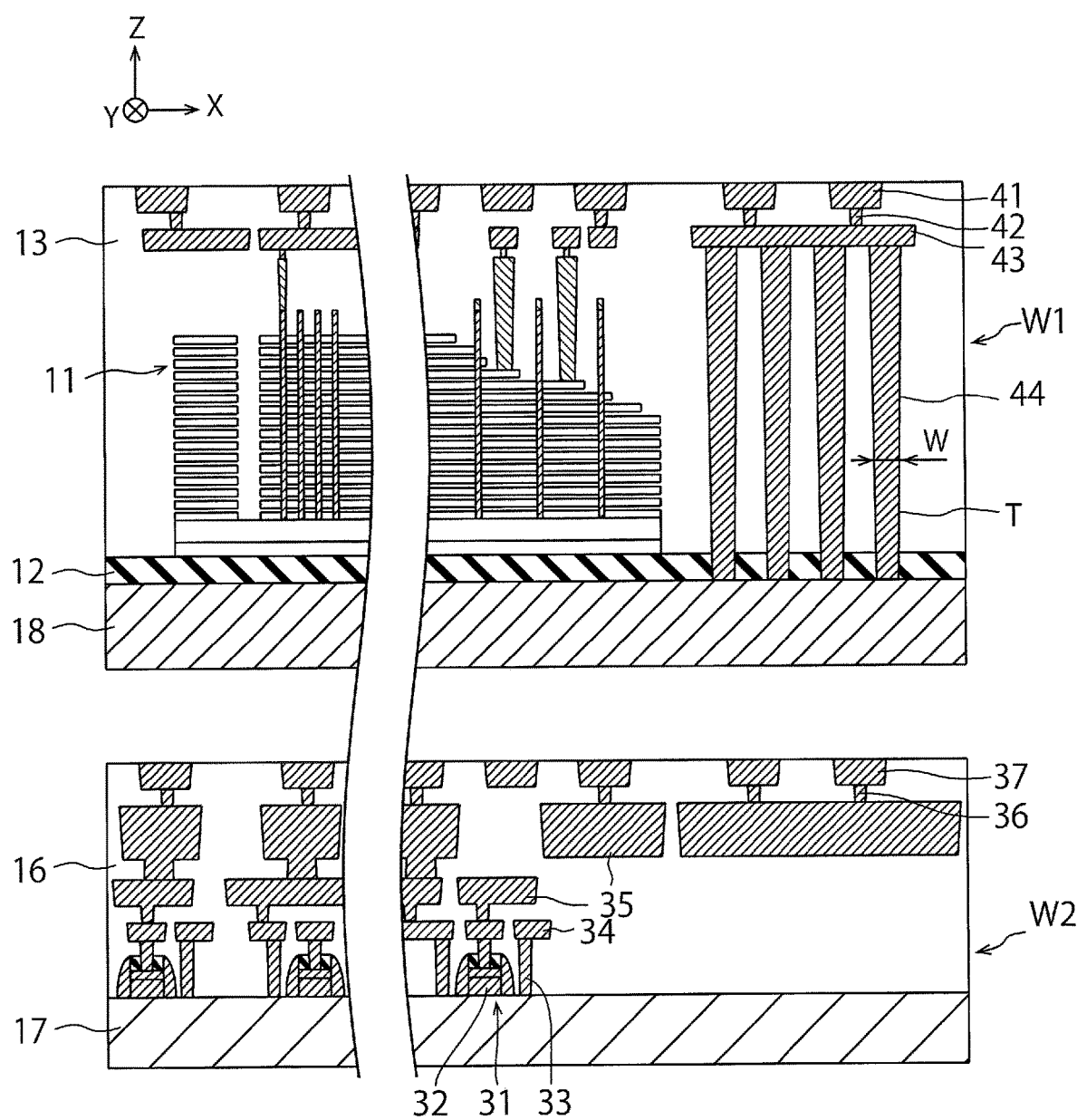
FIGS. 4 to 10 are cross-sectional views illustrating a method of manufacturing the semiconductor device of the first embodiment.

FIG. 4 illustrates an array wafer W1 including a plurality of array chips 1 and a circuit wafer W2 including a plurality of circuit chips 2. The array wafer W1 is also referred to as a memory wafer, and the circuit wafer W2 is also referred to as a CMOS wafer. The array wafer W1 includes the substrate 18 below the insulator 12. The substrate 18 is, for example, a semiconductor substrate such as a silicon substrate. The substrate 18 is an example of a second substrate.

First, the memory wafer W1 and the circuit wafer W2 illustrated in FIG. 4 are prepared. It is noted that FIG. 4 illustrates the cross-section corresponding to FIG. 3, but a direction of the memory wafer W1 in FIG. 4 is opposite to a direction of the memory chip 1 in FIG. 3. FIG. 4 illustrates the memory wafer W1 before the direction is reversed for bonding, and FIG. 3 illustrates the memory chip 1 after the direction is reversed for bonding, and bonding and dicing are performed.

In a process in FIG. 4, the circuit wafer W2 is fabricated by forming the transistors 31 and inter layer dielectric 16 on the substrate 17 and forming the metal pads 37 and the like in the inter layer dielectric 16. For example, the metal pads 37 are formed by being embedded in respective recessed portions that are formed on a surface of the inter layer dielectric 16 by RIE (Reactive Ion Etching).

In the process in FIG. 4, the array wafer W1 is further fabricated by forming the memory cell array 11 and the inter layer dielectric 13 on the substrate 18 with the insulator 12 in between and forming the via plugs 44, the interconnection layer 43, the via plugs 42, and the metal pads 41 in the insulator 12 and the inter layer dielectric 13. For example, the metal pads 41 are formed by being embedded in respective recessed portions that are formed on a surface of the inter layer dielectric 13 by the RIE.

Further, the via plugs 44 are formed in the following manner. First, the insulator 12 and a portion of the inter layer dielectric 13 are formed on the substrate 18. Next, via holes that penetrate through the insulator 12 and the portion of the inter layer dielectric 13 are formed by the RIE. As a result, the via holes are each formed so as to have a tapered side face by action of the RIE. Next, the via plugs 44 are embedded in the respective via holes. As a result, the via plugs 44 are each formed so as to have the tapered side face T, and the width W and the plug diameter of each of the via plugs 44 are set so as to be increased based on a distance from the substrate 18. Thereafter, a remaining portion of the inter layer dielectric 13, the interconnection layer 43, the via plugs 42, and the metal pads 41 are formed on the upper portion of the substrate 18.

Figure 5:
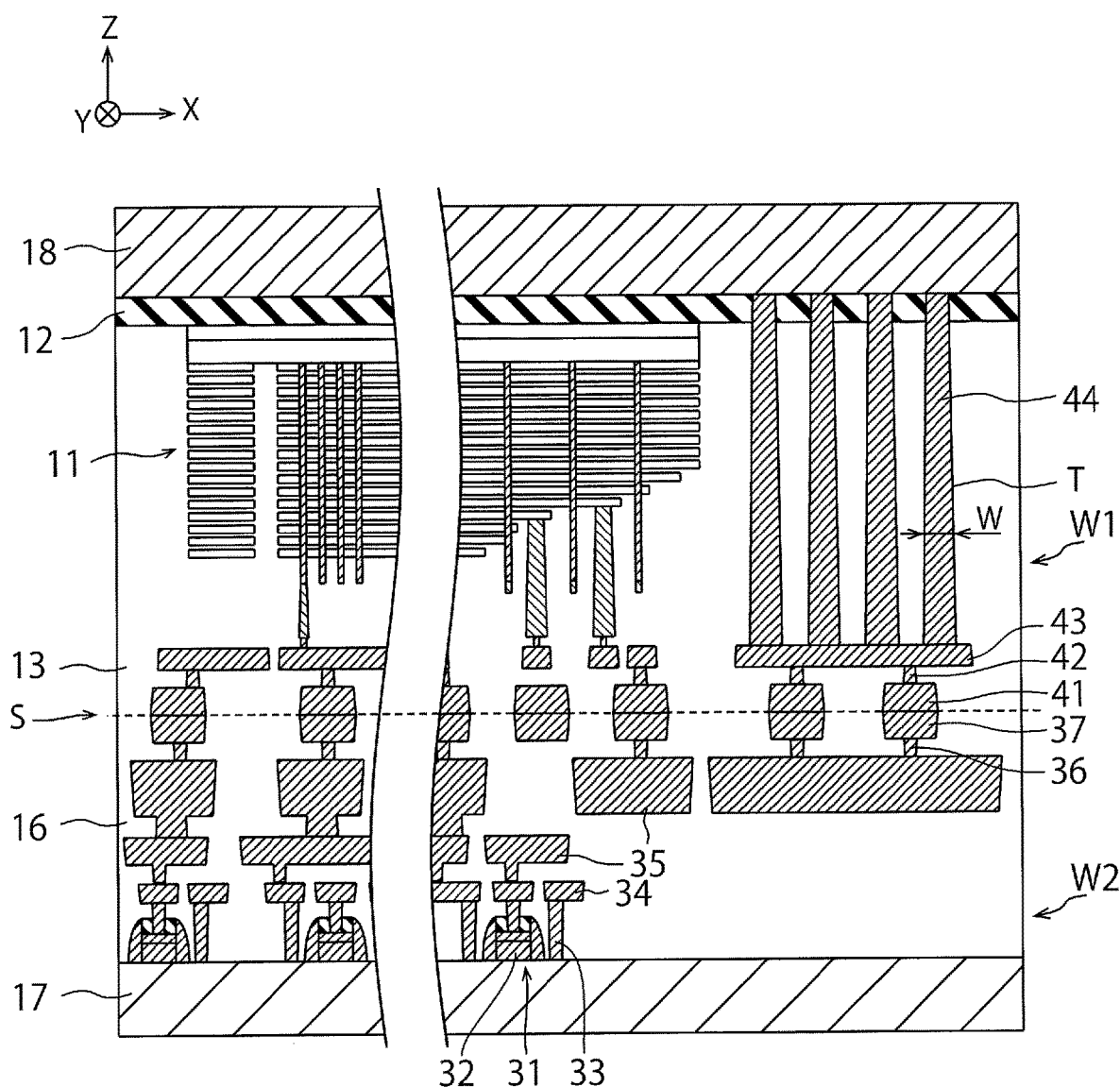

Next, the array wafer W1 is bonded to the circuit wafer W2 (FIG. 5). More specifically, the array wafer W1 and the circuit wafer W2 are first bonded to each other by mechanical pressure. As a result, the inter layer dielectric 13 is stuck to the inter layer dielectric 16. Next, the array wafer W1 and the circuit wafer W2 are annealed at temperature of 250° C. to 400° C. As a result, the metal pads 41 are joined to and electrically connected to the respective metal pads 37. FIG. 5 illustrates a state where the metal pads 41 are disposed on the respective metal pads 37.

Figure 6:
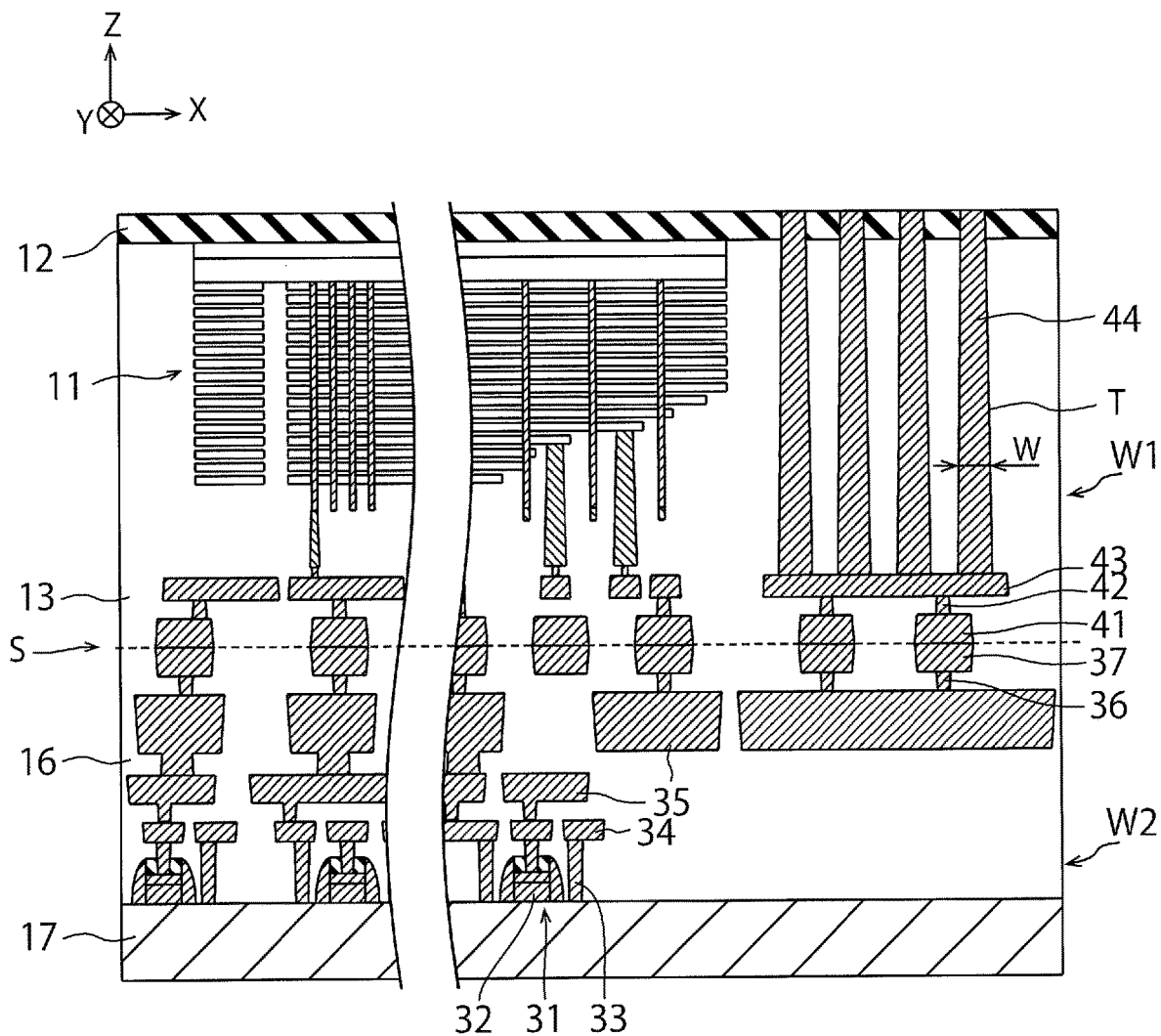

Next, the substrate 18 is removed from the array wafer W1 (FIG. 6). As a result, the via plugs 44 are exposed. The substrate 18 is removed by, for example, CMP (Chemical Mechanical Polishing) or wet etching.

Figure 7:
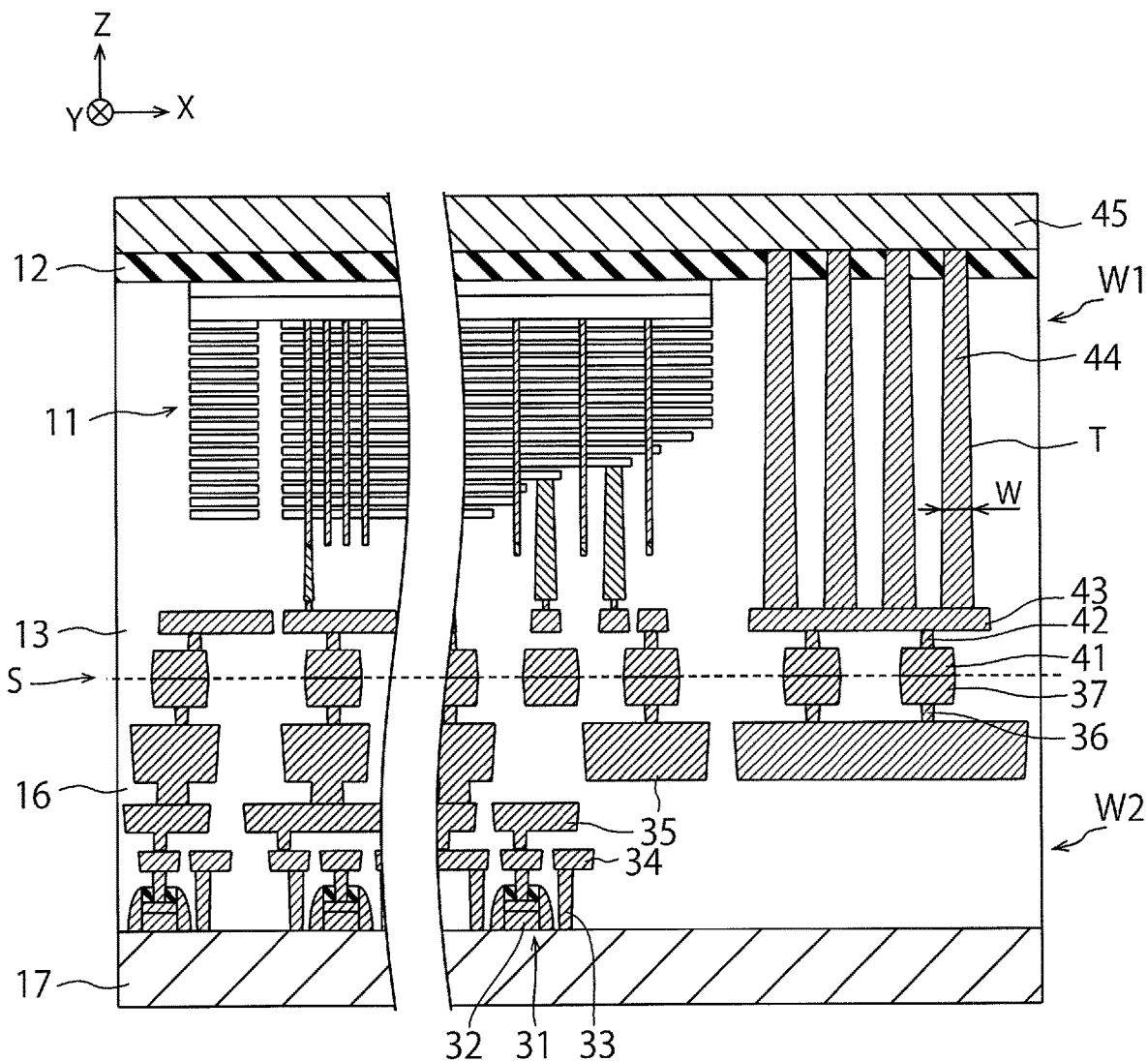
Figure 8:
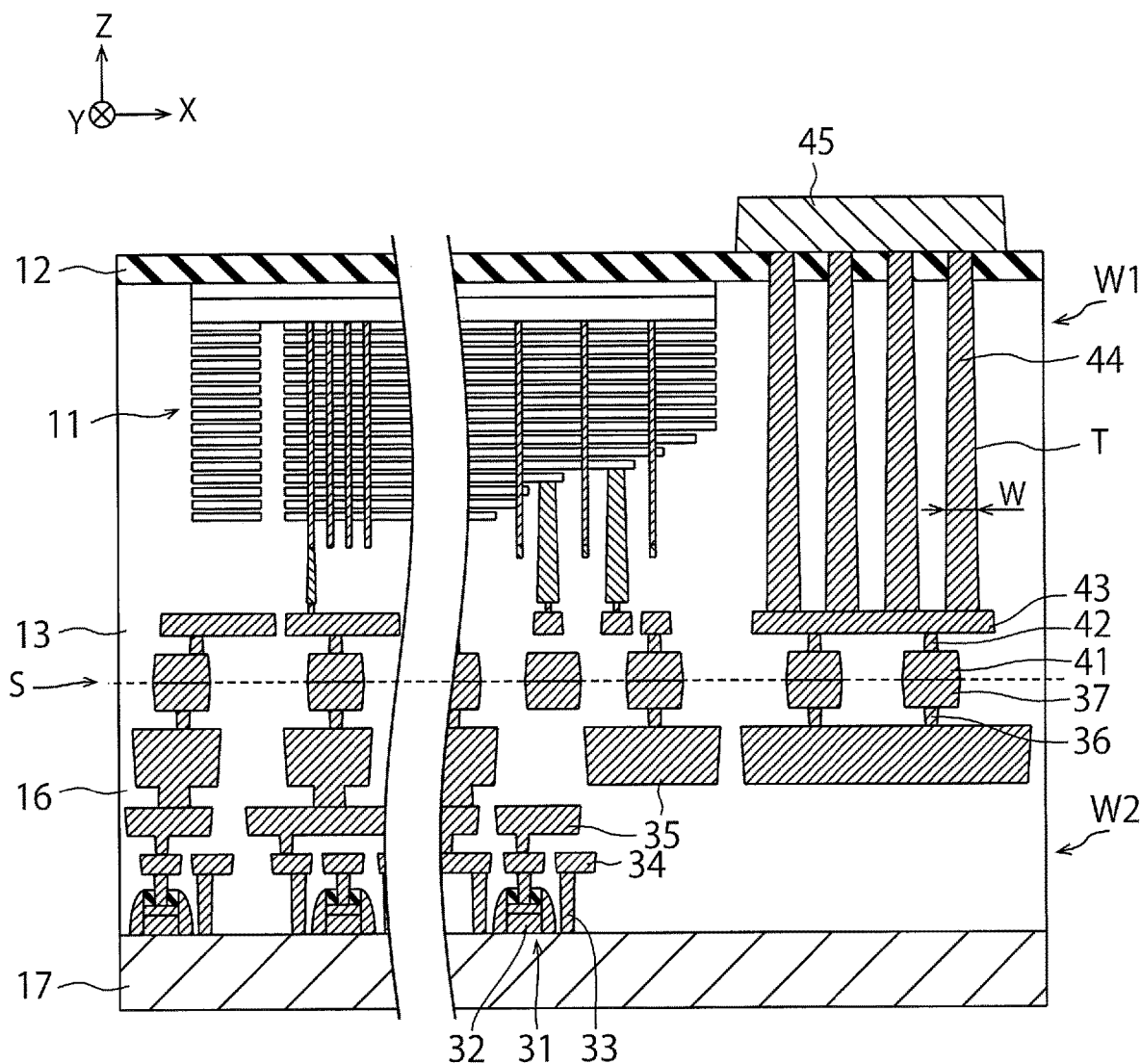

Next, a metal layer to form the metal pad 45 is formed on the insulator 12 and the via plugs 44 (FIG. 7). In FIG. 7, the metal layer is also denoted by the reference numeral 45 in order to facilitate understanding of the description. Next, the metal layer is etched by the RIE to form the metal pad 45 on the via plugs 44 (FIG. 8).

Figure 9:
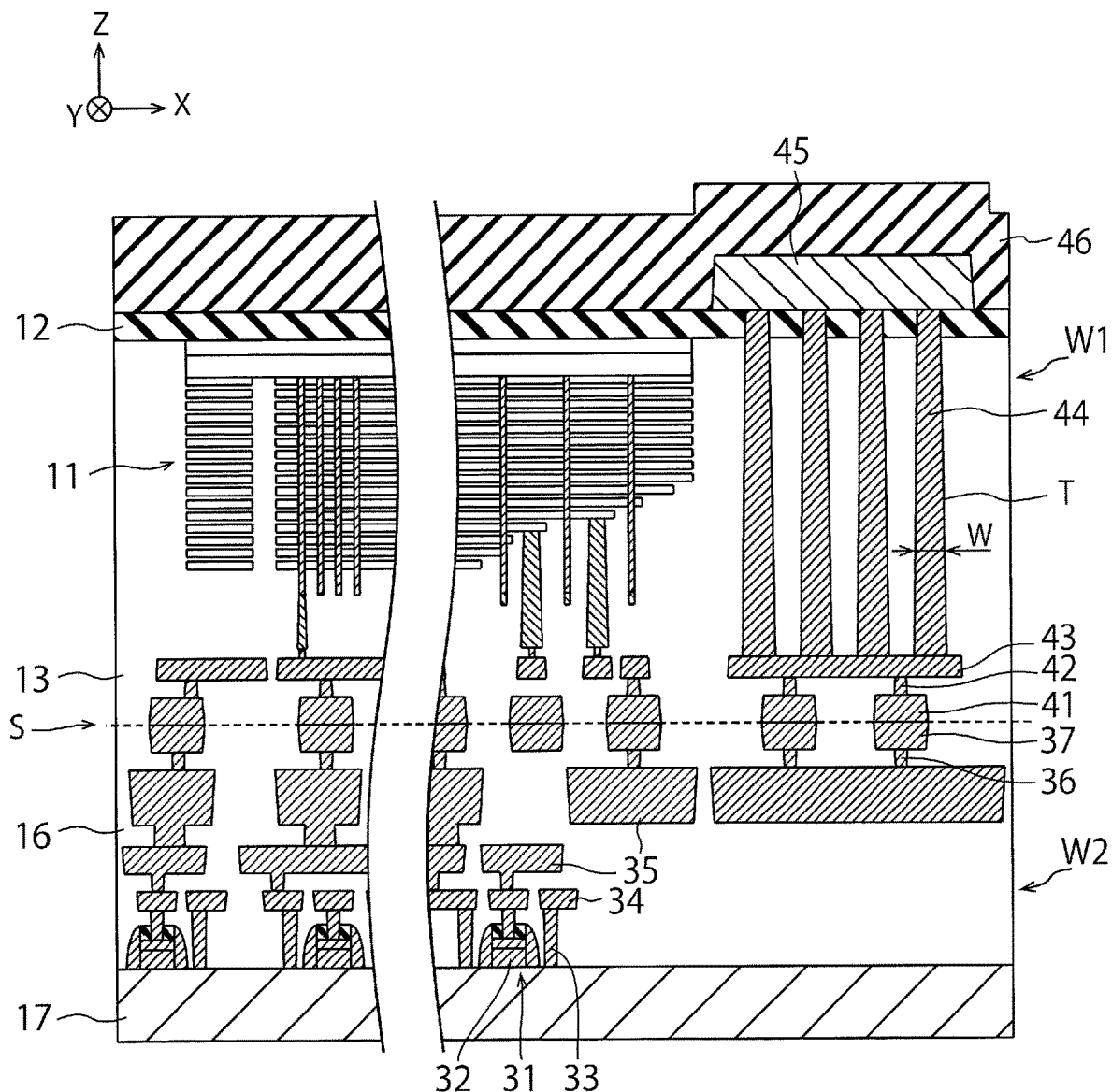
Figure 10:
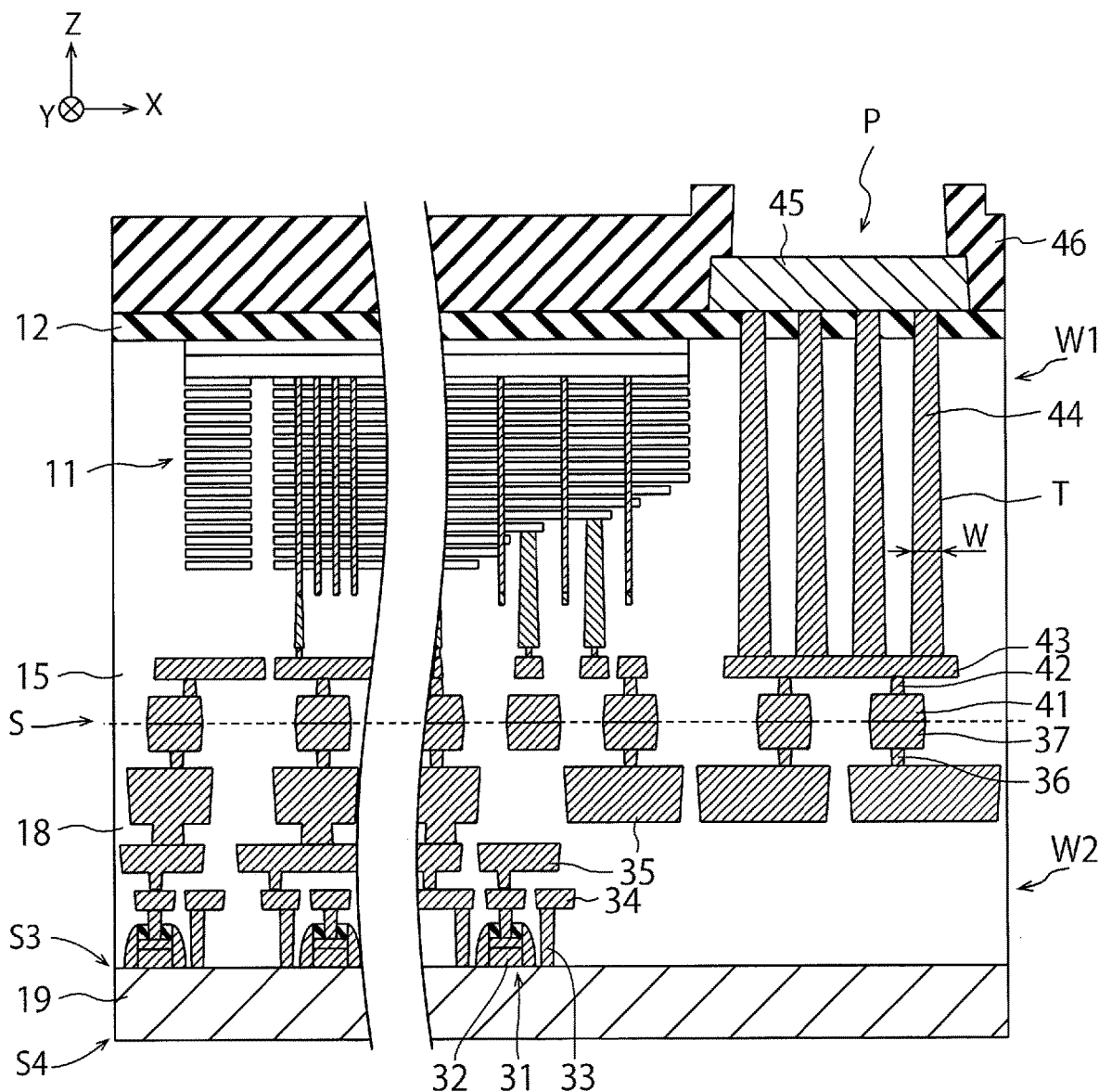

Next, the passivation layer 46 is formed on the insulator 12 and the metal pad 45 (FIG. 9). Then, the passivation layer 46 is etched by the RIE to form the opening P that exposes the upper face of the metal pad 45 in the passivation layer 46 (FIG. 10).

Thereafter, the substrate 17 is reduced in thickness by the CMP, and then, the array wafer W1 and the circuit wafer W2 are cut (diced) into a plurality of chips. The semiconductor device in FIG. 3 is manufactured in the above-described manner.

As described above, the semiconductor device of the present embodiment is manufactured by bonding the array chip 1 (array wafer W1) and the circuit chip 2 (circuit wafer W2). Accordingly, it is necessary to electrically connect the metal pads 41 of the array chip 1 to the metal pad 45. In the present embodiment, the via plugs 44 are formed in the array chip 1 before bonding, and the metal pads 41 are then electrically connected to the metal pad 45 by the via plugs 44. This makes it possible to form the via plugs 44 on the substrate 18 together with the memory cell array 11 and the like. In the present embodiment, the width W of each of the via plugs 44 is reduced based on the distance from the circuit chip 2. This is caused by formation of the via plugs 44 before bonding.

Further, the array chip 1 of the present embodiment includes the plurality of via plugs 44 between the metal pads 41 and the metal pad 45. Therefore, the present embodiment makes it possible to save the material for formation of the via plugs 44 and to easily form the via plugs 44, as compared with a case where one thick via plug is formed. In the present embodiment, such via plugs 44 are disposed not inside the memory cell array 11 but outside the memory cell array 11.

As described above, the present embodiment makes it possible to make the layout and the interconnections of the bonding pads in the semiconductor device formed with use of the bonding technology more preferable.

Although the array wafer W1 and the circuit wafer W2 are bonded to each other in the present embodiment, the array wafers W1 may be bonded to each other or the circuit wafers W2 may be bonded to each other. In other words, a wafer to be bonded may be any kind of wafer. The contents described above with reference to FIG. 1 to FIG. 10 and contents described below with reference to FIG. 11 are applicable to bonding in a case other than the case where the array wafer W1 and the circuit wafer W2 are bonded to each other.

Although FIG. 1 illustrates a boundary bonding face between the insulator 14 and the insulator 15 and a boundary bonding face between the metal pads 41 and the metal pads 37, these boundary bonding faces are not commonly observed after the above-described annealing. The positions of the boundary bonding faces, however, can be estimated by, for example, detecting an inclination of the side face of each of the metal pads 41 and the side face of each of the metal pads 37, or detecting positional displacement of the side face of each metal pad 41 from the side face of the corresponding metal pad 37.

Second Embodiment

Figure 11:
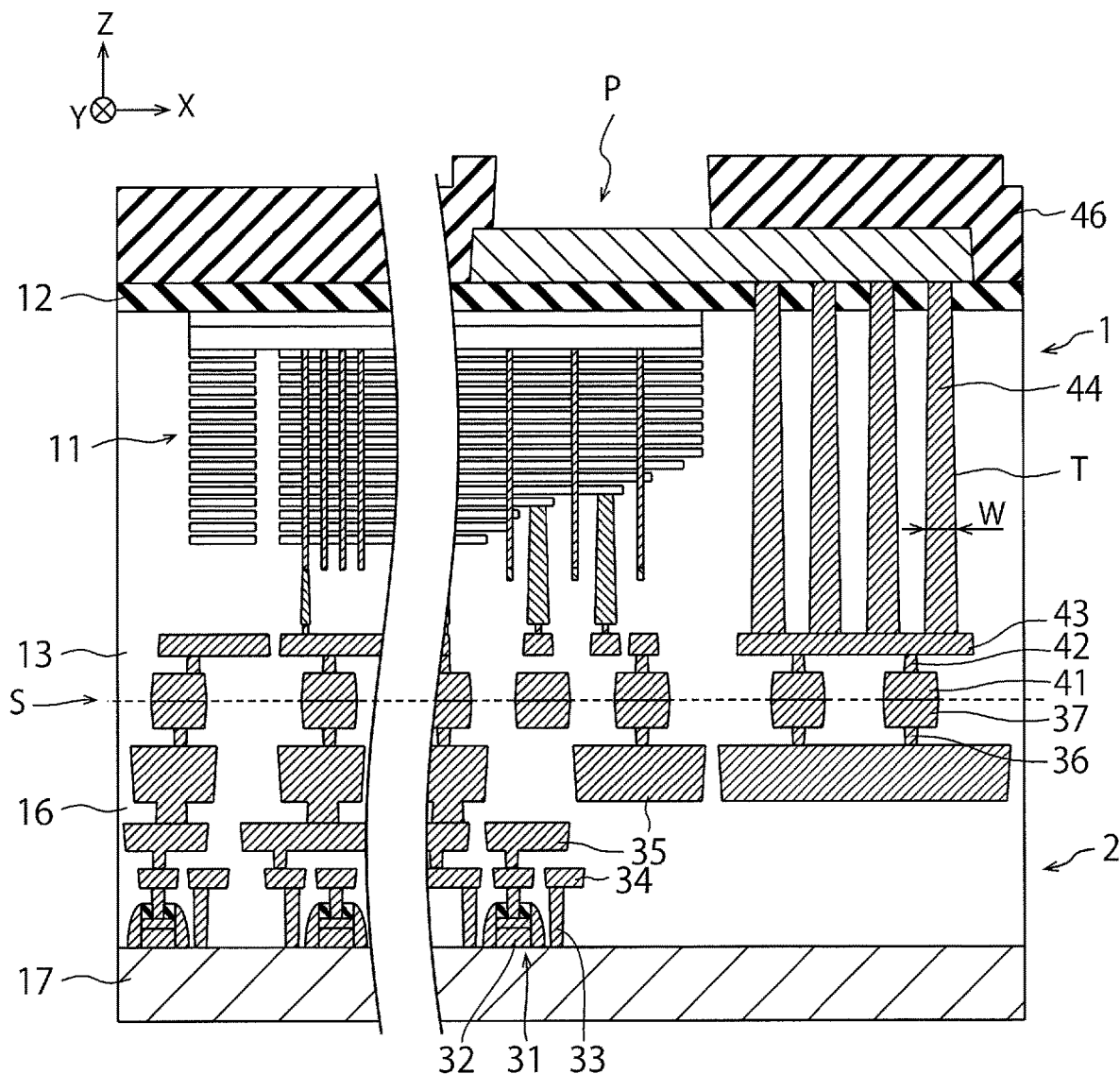
FIG. 11 is a cross-sectional view illustrating a structure of a semiconductor device of a second embodiment.

FIG. 11 is a cross-sectional view illustrating a structure of a semiconductor device of a second embodiment.

The semiconductor device of the present embodiment includes the metal pad 45 and the passivation layer 46, as with the semiconductor device (FIG. 3) of the first embodiment. The metal pad 45 of the present embodiment, however, extends from a region just above the via plugs 44 up to a region just above the memory cell array 11. In addition, the opening P of the present embodiment is provided at a position where the opening P does not overlap with the via plugs 44 in the Z direction but overlaps with the memory cell array 11 in the Z direction. In other words, the opening P of the present embodiment is provided just above the memory cell array 11.

The semiconductor device of the present embodiment can be manufactured through the processes in FIG. 4 to FIG. 10, as with the semiconductor device of the first embodiment. The process in FIG. 8, however, is performed so as to form the metal pad 45 having the shape illustrated in FIG. 11. Further, the process in FIG. 10 is performed so as to form the opening P at the position illustrated in FIG. 11.

According to the first embodiment, it is possible to set the small area of the metal pad 45. In contrast, according to the present embodiment, it is possible to lay out the opening P at various positions. The opening P is provided just above the memory call array 11 in the preset embodiment; however, the opening P may be provided at the other position.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising a first chip and a second chip, wherein
the first chip comprises:
a first substrate;
a control circuit provided on the first substrate;
a first pad provided above the control circuit and electrically connected to the control circuit; and
a third pad provided above the control circuit and electrically connected to the control circuit, and
the second chip comprises:
a second pad provided on the first pad;
a plug provided above the second pad, extending in a first direction, and including a portion that decreases in diameter in a cross-section perpendicular to the first direction with increasing distance from the first substrate;
a bonding pad provided on the plus, intersecting with the first direction, and electrically connected to the second pad by the plug;
a fourth pad provided on the third pad; and
a memory cell array electrically connected to the fourth pad.

2. The device of claim 1, wherein
the second chip further includes an insulator provided on the bonding pad, and
the insulator includes an opening to expose an upper face of the bonding pad.

3. The device of claim 2, wherein the opening is provided at a position where the opening overlaps with the plug in the first direction.

4. The device of claim 1, wherein
a memory cell array in the second chip includes a plurality of electrode layers stacked separately from one another in the first direction,
an end portion of the plug on a side of the first chip is provided at a position lower than a lower face of a lowermost one of the plurality of electrode layers, and
an end portion of the plug on a side opposite to the first chip is provided at a position higher than an upper face of an uppermost one of the plurality of electrode layers.

5. The device of claim 1, wherein the plug has a tapered side face.

6. The device of claim 1, wherein the second chip comprises a plurality of plugs between the second pad and the bonding pad.

7. The device of claim 1, wherein the bonding pad is provided on the plug via no substrate.

8. A semiconductor device comprising a first chip and a second chip, wherein
the first chip comprises:
a first substrate;
a control circuit provided on the first substrate; and
a first pad provided above the control circuit and electrically connected to the control circuit, and
the second chip comprises:
a second pad provided on the first pad;
a plug provided above the second pad, extending in a first direction, and including a portion that decreases in diameter in a cross-section perpendicular to the first direction with increasing distance from the first substrate;
a bonding pad provided on the plug, intersecting with the first direction, and electrically connected to the second pad by the plug; and
an insulator provided on the bonding pad and including an opening to expose an upper face of the bonding pad, the opening being provided at a position where the opening does not overlap with the plug in the first direction.

9. The device of claim 8, wherein the opening is provided at a position where the opening overlaps with a memory cell array inside the second chip in the first direction.

* * * * *